United States Patent
Petrakivskyi et al.

(10) Patent No.: US 11,069,923 B2
(45) Date of Patent: Jul. 20, 2021

(54) BATTERY MANAGEMENT APPARATUS FOR TRANSMITTING AND RECEIVING DATA TO MANAGE BATTERY CELL USING OPTICAL SIGNAL

(71) Applicant: Samsung Electronics Co., Ltd., Suwon-si (KR)

(72) Inventors: Oleg Petrakivskyi, Zhytomyr (UA); Serhiy Khomych, Lviv (UA)

(73) Assignee: Samsung Electronics Co., Ltd., Suwon-si (KR)

( * ) Notice: Subject to any disclaimer, the term of this patent is extended or adjusted under 35 U.S.C. 154(b) by 286 days.

(21) Appl. No.: 16/025,044

(22) Filed: Jul. 2, 2018

(65) Prior Publication Data

US 2019/0229376 A1 Jul. 25, 2019

(30) Foreign Application Priority Data

Jan. 22, 2018 (KR) .......................... 10-2018-0007851

(51) Int. Cl.
| | |
|---|---|
| *H01M 10/42* | (2006.01) |
| *H01M 10/48* | (2006.01) |
| *H01M 10/44* | (2006.01) |
| *H01M 2/10* | (2006.01) |
| *G01R 31/36* | (2020.01) |
| *G01R 31/3835* | (2019.01) |
| *H01M 50/20* | (2021.01) |

(52) U.S. Cl.
CPC ...... *H01M 10/425* (2013.01); *G01R 31/3835* (2019.01); *H01M 10/441* (2013.01); *H01M 10/482* (2013.01); *H01M 10/486* (2013.01); *H01M 50/20* (2021.01); *H01M 2010/4271* (2013.01); *H01M 2220/20* (2013.01)

(58) Field of Classification Search
CPC ............. H01M 10/425; H01M 10/486; H01M 10/441; H01M 10/482; H01M 10/42; H01M 10/48; H01M 2220/20; H01M 2010/4271; H01M 2/1077; G01R 31/362; G01R 31/3835
USPC ....................................................... 320/116
See application file for complete search history.

(56) References Cited

U.S. PATENT DOCUMENTS

| 8,547,065 B2 | 10/2013 | Trigiani |
| 9,436,261 B2 | 9/2016 | Yun |
| (Continued) | | |

FOREIGN PATENT DOCUMENTS

| JP | 5677171 B2 | 2/2015 |
| KR | 10-2014-0124817 A | 10/2014 |
| (Continued) | | |

*Primary Examiner* — Richard Isla
*Assistant Examiner* — Dung V Bui
(74) *Attorney, Agent, or Firm* — NSIP Law

(57) ABSTRACT

A battery management system (BMS) manages a battery using a master device, a sub-master device corresponding to each of battery packs, and a slave device corresponding to each of battery cells. Data is transmitted from the master device through the sub-master device to the slave device using an electrical signal, and the data includes a control message for controlling a battery cell. Data transmitted from the slave device through the sub-master device to the master device using an optical signal, and the data includes information associated with a battery cell acquired in the slave device.

15 Claims, 8 Drawing Sheets

(56) References Cited

U.S. PATENT DOCUMENTS

| | | | | |
|---|---|---|---|---|
| 9,496,730 B2* | 11/2016 | Gallegos | .............. | B60L 3/0046 |
| 9,742,206 B2* | 8/2017 | Ohtsuki | ................ | H02J 7/0021 |
| 2007/0087756 A1* | 4/2007 | Hoffberg | ............. | G06Q 20/065 |
| | | | | 455/450 |
| 2013/0108898 A1 | 5/2013 | Potts et al. | | |
| 2013/0193925 A1* | 8/2013 | Abe | .................... | H01M 10/425 |
| | | | | 320/118 |
| 2014/0001866 A1* | 1/2014 | Abe | ...................... | H02J 7/0031 |
| | | | | 307/77 |
| 2014/0021924 A1* | 1/2014 | Abe | ......................... | H02J 3/32 |
| | | | | 320/118 |
| 2014/0365792 A1* | 12/2014 | Yun | .................... | H02J 7/00036 |
| | | | | 713/320 |
| 2015/0063473 A1* | 3/2015 | Nishibayashi | ......... | H04B 3/542 |
| | | | | 375/257 |
| 2015/0104673 A1* | 4/2015 | de Greet | .............. | H04L 12/437 |
| | | | | 429/7 |

FOREIGN PATENT DOCUMENTS

| WO | WO 2013/038146 A1 | 3/2013 |
|---|---|---|
| WO | WO 2016/199380 A1 | 12/2016 |

* cited by examiner

BATTERY MANAGEMENT APPARATUS FOR TRANSMITTING AND RECEIVING DATA TO MANAGE BATTERY CELL USING OPTICAL SIGNAL

CROSS-REFERENCE TO RELATED APPLICATIONS

This application claims the benefit under 35 USC § 119(a) of Korean Patent Application No. 10-2018-0007851 filed on Jan. 22, 2018 in the Korean Intellectual Property Office, the entire disclosure of which is incorporated herein by reference for all purposes.

BACKGROUND

1. Field

The following description relates to a battery management system.

2. Description of Related Art

A plurality of battery cells may be included in a single battery pack. A plurality of battery packs may operate as a battery that supplies power to a single device, for example, an electric vehicle. A battery management system (BMS) may monitor states of the plurality of battery cells to efficiently operate the plurality of battery packs. To monitor the states of the plurality of battery cells in the plurality of battery packs, the BMS may collect information on the plurality of battery cells using a data bus. The information of each of the plurality of battery cells may be transferred through the data bus based on a bus topology.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, there is provided a battery management system (BMS) associated with battery packs, the BMS including a master device configured to control the battery packs, sub-master devices corresponding to each of the battery packs, and slave devices corresponding to battery cells in the each of the battery packs, wherein the each of the slave devices are configured to communicate with another slave device of the slave devices or the sub-master devices using an optical signal, and the sub-master devices are configured to communicate with the master device.

The optical signal may include sequentially transmitted based on an order in which the slave devices are arranged in each of the battery packs.

A slave device of the slave devices may include an optical signal transceiver configured to communicate with another slave device of the slave devices or a sub-master device of the sub-master devices using the optical signal, a sensor configured to measure a voltage or a temperature of a battery cell corresponding to the slave device, a cell balance controller configured to control a balance in a quantity of electric charge in the battery cells, and a controller configured to control the sensor or the cell balance controller based on a control message in an optical signal received at the optical signal transceiver.

In response to the optical signal being received from the optical signal transceiver, the controller may be configured to separate the control message associated with the battery cell corresponding to the controller from control messages included in the optical signal, and to output, using another optical signal transceiver of the slave device, remaining control messages other than the separated control message to one of the slave devices based on an order in which the slave devices are arranged.

The controller may be configured to output, using the optical signal transceiver, information on the voltage or the temperature measured by the sensor to one of the slave devices based on an order in which the slave devices are arranged.

The controller may be configured to combine information including the voltage or the temperature measured by the sensor with information included in the optical signal and output the combined information using another optical signal transceiver of the slave device, in response to an optical signal being received from the optical signal transceiver.

The sub-master devices may be configured to extract control messages associated with battery cells included in a battery pack corresponding to each of the sub-master devices, from control messages received from the master device, combine the extracted control messages based on an order in which the slave devices corresponding to each of the sub-master devices are arranged, and output an optical signal based on the combined control messages to a first slave device based on the order in which the slave devices are arranged.

The sub-master devices may be configured to combine a flag with a control message corresponding to a last slave device based on the order in which the slave devices are arranged, and wherein the flag verifies that a slave device receiving a control message is the last slave device.

The master device and the sub-master devices may be connected through a wire interface through which an electrical signal including information on each of the battery cells or a control message corresponding to the battery cells is transmitted.

The slave devices may be arranged to correspond to battery cells connected in series.

In another general aspect, there is provided a battery management method performed by a slave device corresponding to a battery cell, the method including receiving an optical signal, determining whether the received optical signal may include a control message associated with the battery cell, generating data to be transmitted to a sub-master device corresponding to a battery pack including the battery cell or to another slave device in the battery pack, in response to the received optical signal comprising the control message associated with the battery cell, and outputting the generated data through an opto-electric transformation.

The receiving of the optical signal may include receiving the optical signal from an optical signal receiver disposed toward the sub-master device or the other slave device.

The generating may include separating the control message associated with the battery cell from the control messages in the received optical signal, and generating the data to be transmitted to the sub-master device or the other slave device based on remaining control messages other than the separated control message.

The battery management method may include controlling the battery cell based on the control message, in response to the received optical signal comprising the control message associated with the battery cell.

The generating may include combining information in the received optical signal with information acquired from the battery cell, in response to the received optical signal not including the control message associated with the battery cell, and generating the data to be transmitted to the sub-master device or the other slave device based on the combined information.

The information acquired from the battery cell may include any one or any combination of a temperature of the battery cell, a voltage of the battery cell, and a cell balancing of a plurality of battery cells including the battery cell.

The outputting may include outputting the generated data using an optical signal transmitter disposed toward the sub-master device or the other slave device.

In another general aspect, there is provided a battery management method performed by a sub-master device corresponding to a battery pack, the method including receiving control messages associated with battery cells included in the battery pack from a master device connected through a wire interface, combining the received control messages based on an order in which slave devices controlling each of the battery cells are connected in series, and generating an optical signal including the combined control messages, wherein the slave devices communicates with one another using the optical signal.

The battery management method may include outputting the generated optical signal to a first slave device among the slave devices based on the order in which the slave devices are connected in series.

The combined control messages may be sequentially transmitted to the slave devices based on the order in which the slave devices are connected in series.

Other features and aspects will be apparent from the following detailed description, the drawings, and the claims.

Figure 1:
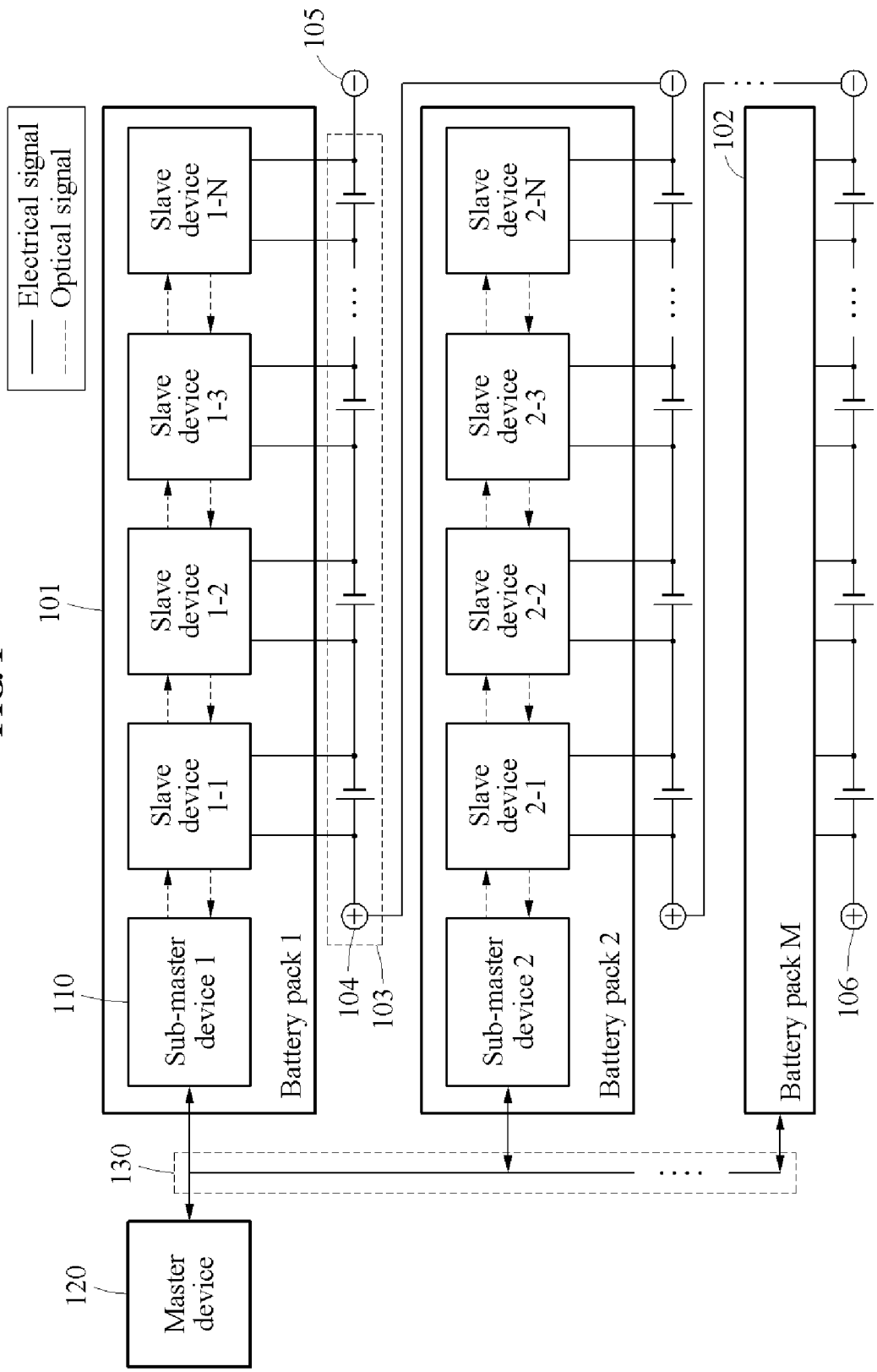
FIG. 1 illustrates an example of a battery management system (BMS).

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

The terminology used herein is for describing various examples only, and is not to be used to limit the disclosure. The articles "a," "an," and "the" are intended to include the plural forms as well, unless the context clearly indicates otherwise.

Examples set forth hereinafter may be implemented as any of various types of products such as, for example, vehicles and mobile terminals.

The vehicle described herein refers to any mode of transportation, delivery, or communication such as, for example, an automobile, a truck, a tractor, a scooter, a motorcycle, a cycle, an amphibious vehicle, a snowmobile, a boat, a public transit vehicle, a bus, a monorail, a train, a tram, an autonomous or automated driving vehicle, an intelligent vehicle, a self-driving vehicle, an unmanned aerial vehicle, an electric vehicle (EV), a hybrid vehicle, a smart mobility, or a drone. In an example, smart mobility may include mobility devices such as, for example, electric wheels, an electric kickboard, an electric bike, and a motorcycle.

The mobile terminal described herein refers to any devices such as, for example, an intelligent agent, a mobile phone, a cellular phone, a smart phone, a wearable smart device (such as, a ring, a watch, a pair of glasses, glasses-type device, a bracelet, an ankle bracket, a belt, a necklace, an earring, a headband, a helmet, a device embedded in the cloths, or an eye glass display (EGD)), a server, a personal computer (PC), a laptop, a notebook, a subnotebook, a netbook, an ultra-mobile PC (UMPC), a tablet personal computer (tablet), a phablet, a mobile internet device (MID), a personal digital assistant (PDA), an enterprise digital assistant (EDA), a digital camera, a digital video camera, a portable game console, an MP3 player, a portable/personal multimedia player (PMP), a handheld e-book, an ultra mobile personal computer (UMPC), a portable lab-top PC, a global positioning system (GPS) navigation, a personal navigation device, portable navigation device (PND), a handheld game console, an e-book, a high definition television (HDTV), a smart appliance, communication systems, image processing systems, graphics processing systems, a kiosk, various Internet of Things (IoT) devices that are controlled through a network, other consumer electronics/information technology (CE/IT) device, or any other device capable of wireless communication or network communication consistent with that disclosed herein. However, the mobile terminal is not limited to the examples described in the forgoing.

FIG. 1 illustrates an example of a battery management system (BMS).

A device that uses an electric energy such as an electric vehicle and an energy storage system (ESS) includes a battery as a power supply. In an example, the battery includes at least one battery cell that is a secondary battery or an electric condenser to store power through charging. A battery cell is, for example, a lithium ion battery (Li-ion), a Li-ion polymer battery, a lead electric condenser, a nickel-cadmium (NiCd) battery, and a nickel-hydride (NiMH) battery. A battery pack is a group of a plurality of battery cells. The battery includes a plurality of battery packs. In the example of FIG. 1, a battery includes M battery cells including a battery pack 1 101 through a battery pack M 102. Also, each battery pack includes N battery cells. The battery of FIG. 1 includes M×N battery cells.

A device using an electric energy, such as, for example, an electric vehicle uses an electric energy of a relatively high voltage. To output the electric energy of the high voltage, a plurality of battery cells are connected in series in a battery pack and a plurality of battery packs are connected in series. Referring to FIG. 1, N battery cells 103 included in the battery pack 1 101 are connected in series. Thus, a voltage of a positive output terminal 104 and a negative output terminal 105 at which an electric energy of the battery pack 1 101 is output corresponds to a combination of voltages of the N battery cells 103 included in the battery pack 1 101.

The battery pack 1 101 through the battery pack M 102 are connected in series. Referring to FIG. 1, the battery pack 1 101 through the battery pack M 102 are connected in series, whereby the negative output terminal 105 of the battery pack 1 101 and the positive output terminal 106 of the battery pack M 102 are connected to an external device of the battery. A voltage between the positive output terminal 106 of the battery pack M 102 and the negative output terminal 105 of the battery pack 1 101, i.e., a combination of voltages of the battery pack 1 101 through the battery pack M 102 corresponds to a voltage output from the battery. By combining the voltages of the battery pack 1 101 through the battery pack M 102, the battery outputs an electric energy of a relatively high voltage.

A battery management system includes at least one device configured to manage the battery. The battery management system refers to a system for managing a rechargeable battery. Since the plurality of battery cells included in the battery is grouped using a battery pack, the battery management system uses the battery pack to manage the plurality of battery cells.

The BMS includes a master device 120 to control the battery. A single master device is provided for each BMS. Since the plurality of battery cells included in the battery is grouped using the battery pack, the master device 120 controls the battery by controlling the plurality of battery packs. The BMS corresponds to each of the plurality of battery packs and includes a plurality of sub-master devices to control a plurality of battery cells included in the corresponding battery pack. Referring to FIG. 1, the BMS includes a sub-master device 1 110 through a sub-master device M (not shown) corresponding to the battery pack 1 101 through the battery pack M 102, respectively. The BMS corresponds to each of the plurality of battery cells and includes a plurality of slave devices to control the corresponding battery cell. Referring to FIG. 1, N slave devices respectively control the N battery cells 103 in the battery pack 1 101.

Battery cells are arranged in series in a battery pack. Slave devices are arranged in each of the battery cells arranged in series. For example, the slave devices are arranged along an axis on which the battery cells are arranged. A sub-master device is disposed in one side of the battery cells arranged in series. Thus, the sub-master device is disposed along an axis on which the slave devices are arranged. In the battery pack, the sub-master device and the slave devices are arranged on the same axis. In the battery pack, the sub-master device and the slave devices communicate with each other using an optical signal. The optical signal is transmitted along the axis.

Referring to FIG. 1, a plurality of slave devices corresponding to the battery pack 1 101 is referred to as a slave device 1-1, a slave device 1-2, . . . , a slave device 1-N based on an ascending order of a distance from the sub-master device 1 110. Similarly, in a battery pack k, a slave device corresponding to an $m^{th}$ battery cell based on a sub-master device k is referred to as a slave device k-m. A battery cell corresponding to the slave device k-m is referred to as a battery cell k-m.

A slave device receives a power from a battery cell corresponding to the slave device. The slave device acquires information on a state of the battery cell. The information on the state of the battery cell includes information such as, for example, a power, a current, a voltage, and a temperature anode overpotential condition, a cathode overpotential condition, an anode surface lithium ion concentration condition, a cathode surface lithium ion concentration condition of the battery cell. In an example, the slave device generates an optical signal including the acquired information and provides the generated optical signal to a sub-master device on the same axis as the slave device.

When another slave device is present between the slave device and the sub-master device, the optical signal is sequentially transferred to another slave device, and then transferred to the sub-master device. When another slave device receives the optical signal, it combines the optical signal with information acquired by another slave device.

As such, the optical signal received by the sub-master device includes the information acquired by the slave device that generated the optical signal and the information acquired by another slave device between the slave device and the sub-master device. The sub-master device transmits the information included in the optical signal to the master device 120.

In an example, the master device 120 and the plurality of sub-master devices are connected through a wire interface 130. In an example, the wire interface 130 is a data bus based on a controller area network (CAN), for example, a CAN-bus. The master device 120 uses the wire interface 130 to receive information acquired by each of the plurality of sub-master devices. The information includes information associated with a battery cell corresponding to a slave device. In an example, the master device 120 detects a current output from the battery. In an example, the master device 120 measures an amount of current output from the positive output terminal 106 of the battery pack M 102.

In an example, the master device 120 executes an algorithm for managing the battery to determine the states of the battery cells based on the acquired information. The master device 120 determines, for example, a state of charge (SoC) and a state of health (SoH) of each of the battery cells. Also, the master device 120 generates a control message to control charging and discharging of each of the battery cells. The master device 120 generates the control message to perform a cell balancing control for equalizing a quantity of electric charge in each of the battery cells. The master device 120 outputs the generated control message to the wire interface 130. Through the wire interface 130, the control message is transmitted in a form of an electrical signal to all sub-master devices connected to the master device 120.

When the control message is received through the wire interface 130, each of the plurality of sub-master devices extracts a control message associated with a battery pack corresponding to each of the plurality of sub-master devices (for example, a control message associated with a battery cell included in the battery pack). In an example, each of the plurality of sub-master devices outputs the extracted control message in a form of an optical signal. For example, when a sub-master device transmits a plurality of control messages, the optical signal is generated based on a combination of the plurality of control messages. In this example, the optical signal is transmitted in an order from a slave device closest to the sub-master device to a slave device farthest from the sub-master device on an axis on which the sub-master device and slave devices are located. In an example, a slave device receiving the optical signal separates a control message associated with a battery cell corresponding to the slave device from the received optical signal.

Figure 2:
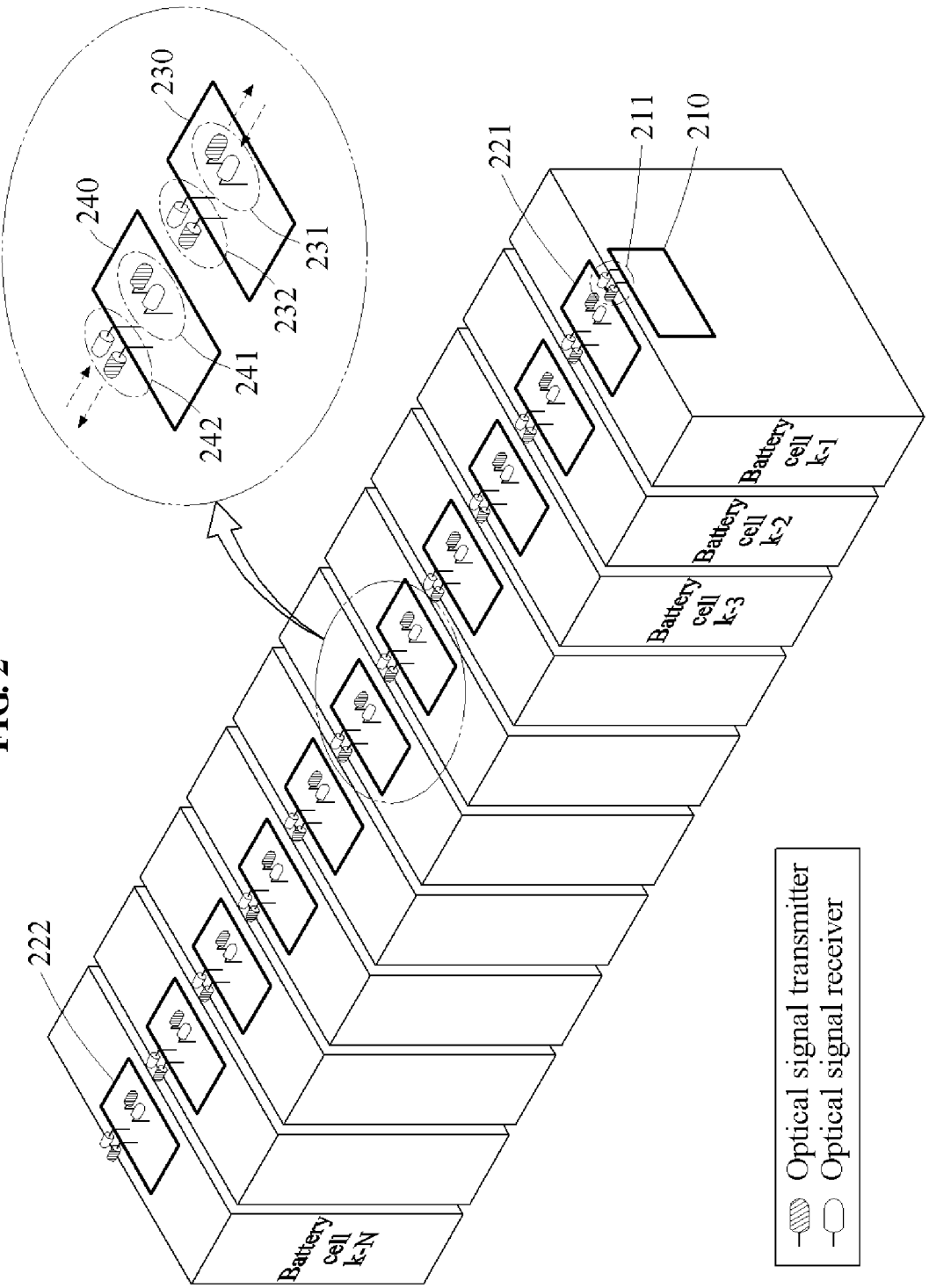
FIG. 2 illustrates an example of a sub-master device and slave devices arranged in a battery pack of a BMS.

FIG. 2 illustrates an example of a sub-master device 210 and slave devices arranged in a battery pack of a BMS.

Referring to FIG. 2, a battery pack k includes N battery cells. In an example, the N battery cells are in the same shape and arranged in series in the battery pack k. The N battery cells are connected in series in an arrangement order to output an electric energy of a relatively high voltage to outside the battery pack k.

A BMS includes a sub-master device 210 configured to control the battery pack k. The sub-master device 210 communicates with a master device configured to control a plurality of battery packs including the battery pack k. The sub-master device 210 communicates with a slave device configured to control each of the N battery cells. To communicate with the slave device that controls each of the N battery cells, the sub-master device 210 includes an optical signal transceiver 211. The sub-master device 210 supports communications between the master device and slave devices.

In an example, the sub-master device 210 is arranged in a first or last battery cell of battery cells arranged in series. As illustrated in FIG. 2, a battery cell k-1 is a battery cell in which the sub-master device 210 is disposed. Also, battery cells are referred to as battery cell k-2, a battery cell k-3, ..., a battery cell k-N in an order from a battery cell closest to the battery cell k-1 to a battery cell farthest from the battery cell k-1. The battery cells k-2 through k-N−1 are adjacent to two battery cells except the battery cell k-1 and the battery cell k-N.

The BMS includes N slave devices corresponding to the N battery cells, respectively. Each of the slave devices is disposed in a corresponding battery cell. Referring to FIG. 2, slave devices k-1 221 through k-N 222 correspond to the battery cells k-1 through k-N, respectively. The slave device k-1 221 that controls the battery cell k-1 is arranged in the battery cell k-1. Likewise, a slave device k-x that controls a battery cell k-x is arranged in the battery cell k-x.

Each of the slave devices k-1 221 through k-N 222 is arranged on the same side of the corresponding battery cell. In the example of FIG. 2, the slave devices k-1 221 through k-N 222 are arranged on tops of the battery cells k-1 through k-N. In an example, the slave devices k-1 221 through k-N 222 are arranged on the same axis. When the slave devices k-1 221 through k-N 222 communicate using an optical signal, the optical signal is transmitted along an axis on which the slave devices k-1 221 through k-N 222 are arranged. When a plurality of slave devices communicates using an optical signal, are arranged on a axis, and are connected in series, a battery may be manufactured at a relatively low cost.

In an example, a slave device of a BMS includes at least two optical signal transceivers. An optical signal transceiver includes an optical signal transmitter and an optical signal receiver. In an example, the optical signal transmitter includes a light emitting diode (LED) and generates an optical signal corresponding to a preset wavelength band (for example, an infrared wavelength band) from an input electrical signal. In an example, the optical signal receiver includes a photo diode (PD) and changes the received optical signal corresponding to the preset wavelength band (for example, an infrared wavelength band) to an electrical signal.

FIG. 2 illustrates an enlarged portion including a slave device k-a 230 and a slave device k-b 240 among the slave device k-1 221 through the slave device k-N 222, a and b being natural numbers and satisfying 1≤a<b≤N. For example, the slave device k-a 230 and the slave device k-b 240 are adjacent to each other. The slave device k-a 230 includes two optical signal transceivers 231 and 232. The slave device k-b 240 includes two optical signal transceivers 241 and 242.

When a slave device includes two optical signal transceivers, each of the optical signal transceivers is disposed toward, for example, facing an optical signal transceiver of another slave device adjacent to the slave device. Referring to FIG. 2, the optical signal transceiver 232 of the slave device k-a 230 is disposed toward the optical signal transceiver 241 of the slave device k-b 240. Although not shown, the optical signal transceiver 231 of the slave device k-a 230 is disposed toward an optical signal transceiver of a slave device k-a−1. If a=1, the optical signal transceiver 231 of the slave device k-a 230 is disposed toward the optical signal transceiver 211 of the sub-master device 210. If b=N, the optical signal transceiver 242 of the slave device k-b 240 is not disposed toward a slave device.

When an optical signal transceiver of a slave device is disposed toward an optical signal transceiver of another slave device, optical signal transmitters and optical signal receivers of the optical signal transceivers are arranged alternately. An optical signal transmitter of the optical signal transceiver 232 of the slave device k-a 230 is disposed toward an optical signal receiver of the optical signal transceiver 241 of the slave device k-b 240. Likewise, an optical signal receiver of the optical signal transceiver 232 of the slave device k-a 230 is disposed toward an optical signal transmitter of the optical signal transceiver 241 of the slave device k-b 240. If a=1, an optical signal transmitter of the optical signal transceiver 231 of the slave device k-a 230 is disposed toward an optical signal receiver of the optical signal transceiver 211 of the sub-master device 210. Also, an optical signal receiver of the optical signal transceiver 231 of the slave device k-a 230 is disposed toward an optical signal transmitter of the optical signal transceiver 211 of the sub-master device 210.

A slave device relays an optical signal received from a slave device on one side to a slave device on another side using two optical signal transceivers. For example, if 1<c<N, c being a natural number, a slave device k-c transmits an optical signal transferred from a slave device k-c+1 to a slave device k-c−1. Likewise, a slave device k-c transmits the optical signal transferred from the slave device k-c−1 to the slave device k-c+1.

The slave device k-b 240 transmits an optical signal that is received using an optical signal receiver of the optical signal transceiver 242, to the slave device k-a 230 using an optical signal transmitter of the optical signal transceiver 241. The slave device k-a 230 receives the optical signal transmitted from the optical signal transmitter of the optical signal transceiver 241 using the optical signal receiver of the optical signal transceiver 232 adjacent to the optical signal transceiver 241.

The slave device k-a 230 transmits an optical signal that is received using an optical signal receiver of the optical signal transceiver 232, to a slave device k-a−1 using the optical signal transmitter of the optical signal transceiver 231. If a=1, the optical signal output from the optical signal transmitter of the optical signal transceiver 231 is transmitted to the optical signal receiver of the optical signal transceiver 211 of the sub-master device 210.

A slave device receiving an optical signal performs different operations associated with the optical signal based on a type of data included in the received optical signal. In an example, when an optical signal including control messages associated with battery cells is provided from the sub-master device 210, the slave device extracts a control message associated with a corresponding battery cell. The slave device controls the battery cell based on the extracted control message. In an example, the optical signal relayed by the slave device is an optical signal from which the extracted control message is separated. In another example, when an optical signal includes information associated with a state of a battery cell other than a battery cell corresponding to the slave device, the slave device combines information associated with a state of the corresponding battery cell with the optical signal and relays the combined result. A plurality of slave device and a sub-master device transmit and receive data using an optical signal bus that relays an optical signal.

Figure 3:
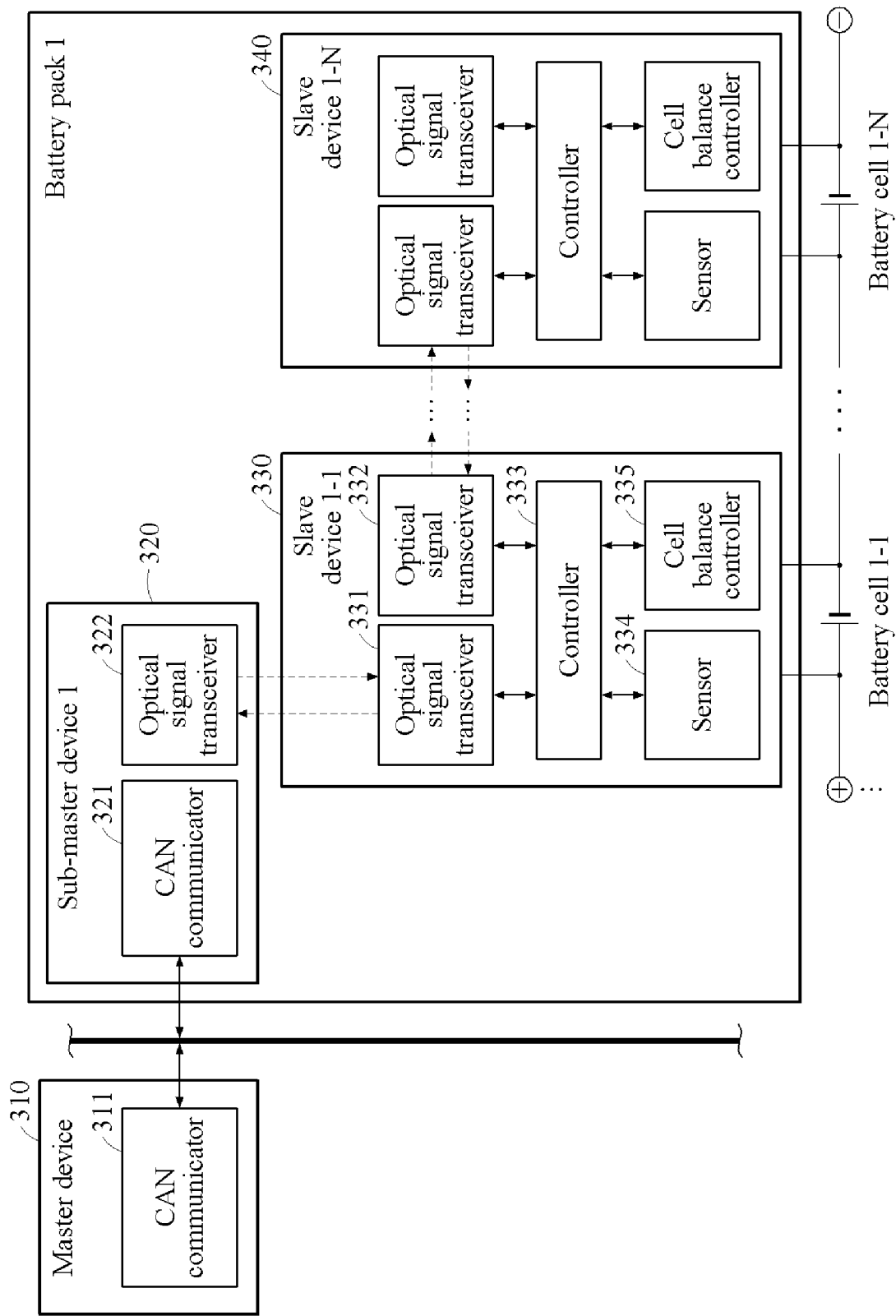
FIG. 3 illustrates an example of devices included in a BMS.

FIG. 3 illustrates an example of devices included in a BMS.

Referring to FIG. 3, a master device 310 of a BMS includes a CAN communicator 311 connected to a wire interface. The CAN communicator 311 outputs an electrical signal to the wire interface or receives an electrical signal from the wire interface based on a CAN protocol. A control message generated in the master device 310 is output through the CAN communicator 311. Information acquired from a battery cell is transferred to the master device 310 through the CAN communicator 311.

In an example, the wire interface connects the master device 310 and a plurality of sub-master devices corresponding to a plurality of battery packs based on a bus topology. When any one of the plurality of sub-master devices and the master device 310 outputs an electrical signal to the wire interface, the master device 310 and the plurality of sub-master devices connected through the wire interface receive the electrical signal. Each of the master device 310 and the plurality of sub-master devices connected through the wire interface determines whether the electrical signal received through the wire interface is its own relevant electrical signal.

FIG. 3 illustrates a sub-master device 1 320 corresponding to a battery pack 1 among the plurality of sub-master devices connected to the master device 310. In an example, the sub-master device 1 320 includes a CAN communicator 321 configured to communicate with the master device 310 through the wire interface. The CAN communicator 321 identifies an electrical signal associated with the sub-master device 1 320 or a plurality of battery cells included in the battery pack 1, from electrical signals transferred through the wire interface. The identified electrical signal includes a control message associated with the plurality of battery cells included in the battery pack 1.

In an example, the sub-master device 1 320 includes an optical signal transceiver 322 configured to transmit and receive an optical signal to support communication with a plurality of slave devices using the optical signal as well as communication with the master device 310 using an electrical signal. In an example, the optical signal transceiver 322 transmits and receives the optical signal based on an infrared data association (IRDA) protocol. As the electrical signal identified by the CAN communicator 321, the electrical signal associated with the sub-master device 1 320 or the plurality of battery cells included in the battery pack 1 is transmitted to the plurality of battery cells included in the battery pack 1 through the optical signal transceiver 322.

FIG. 3 illustrates N slave devices corresponding to N battery cells included in the battery pack 1. The battery pack 1 is in a similar structure described with reference to FIG. 2. Similar to the example of FIG. 2, the N battery slave devices are referred to as a slave device 1-1 330 through a slave device 1-N 340 in an order from a slave device closest to the sub-master device 1 320 to a slave device farthest from the sub-master device 1 320.

A slave device includes at least two optical signal transceivers to transmit and receive an optical signal to and from a device adjacent to a battery pack. The optical signal transceivers included in the slave device are arranged to be adjacent to different devices based on line-of-sights of optical signal transceivers of the adjacent devices. The device adjacent to the optical signal transceivers included in the slave devices is, for example, a sub-master device or another slave device based on an arrangement of the slave device.

Referring to FIG. 3, the slave device 1-1 330 includes two optical signal transceivers 331 and 332. The optical signal transceiver 331 is disposed toward the optical signal transceiver 322 of the sub-master device 1 320. The optical signal transceiver 332 disposed toward one of optical signal transceivers of the slave device 1-N 340. A structure in which the optical signal transceivers 322, 331, and 332 are disposed toward each other may be similar to the structure as described with reference to FIG. 2, the descriptions of FIG.

2 is also applicable to FIG. 3, and are incorporated herein by reference. Thus, the above description may not be repeated here.

In an example, a slave device includes a controller that controls a battery cell corresponding to the controller based on a control message provided from a sub-master device. In an example, the slave device includes a sensor that collects information associated with the corresponding battery cell. In an example, the slave device includes a cell balance controller used to perform cell balancing.

The slave device 1-1 330 includes a controller 333, a sensor 334, and a cell balance controller 335. The controller 333 separates a control message corresponding to a battery cell 1-1 from an optical signal provided from the sub-master device 1 320 to the slave device 1-1 330. When the optical signal provided from the sub-master device 1 320 to the slave device 1-1 330 includes the control message corresponding to the battery cell 1-2, the controller 333 changes the optical signal to generate an optical signal to be transmitted to a slave device 1-2 (not shown). An operation of the controller 333 changing the optical signal provided from the sub-master device 1 320 to the slave device 1-1 330 will be further described later.

The controller 333 charges or discharges the battery cell 1-1 based on the control message corresponding to the battery cell 1-1. The controller 333 connects the battery cell 1-1 to a circuit (for example, a power bus of the battery pack 1) to which a plurality of battery cells of the battery pack 1 is connected based on the control message. The control message is generated based on an SoC of each of the battery cells received in the master device 310. The controller 333 controls the cell balance controller 335 based on the control message.

In an example, the controller 333 switches an operation mode of the controller 333 to a sleep mode based on the control message. The master device 310 performs a wake-up control on the controller 333 based on the control message. When the operation mode is switched to the sleep mode, the controller 333 determines whether the optical signal is received by the optical signal transceivers 331 and 332 at preset intervals. When the optical signal is received by the optical signal transceivers 331 and 332, the controller 333 wakes up from the sleep mode and processes the received optical signal.

The sensor 334 measures the information associated with the battery cell 1-1, such as, for example, a voltage, a current, a temperature, and a power of the battery cell 1-1 in real time. The information acquired from the sensor 334 is provided to the master device 310.

To provide the information acquired from the sensor 334 to the master device 310, the controller 333 inputs the information acquired from the sensor 334 to the optical signal transceiver 331. The optical signal transceiver 331 transforms the input information into an optical signal and outputs the optical signal to the optical signal transceiver 322 of the sub-master device 1 320.

When the optical signal is received through an optical signal transceiver disposed toward the slave device 1-2, the controller 333 combines the received optical signal with the information acquired from the sensor 334 and transmits the combination to the sub-master device 1 320. When the controller 333 transmits the information acquired from the sensor 334 and the optical signal received from another slave device 1-2, the optical signal received from the slave device 1-2 may be changed.

When the sub-master device 1 320 receives optical signal including information acquired by a sensor of each of a plurality of slave devices through the optical signal transceiver 322, the sub-master device 1 320 changes the received optical signal to an electrical signal and transmits the electrical signal to the master device 310. The electrical signal is output to a wire interface through the CAN communicator 321. The master device 310 receives, the electrical signal changed by the sub-master device 1 320, i.e., information on battery cells in the battery pack 1 through the CAN communicator 311.

Figure 4:
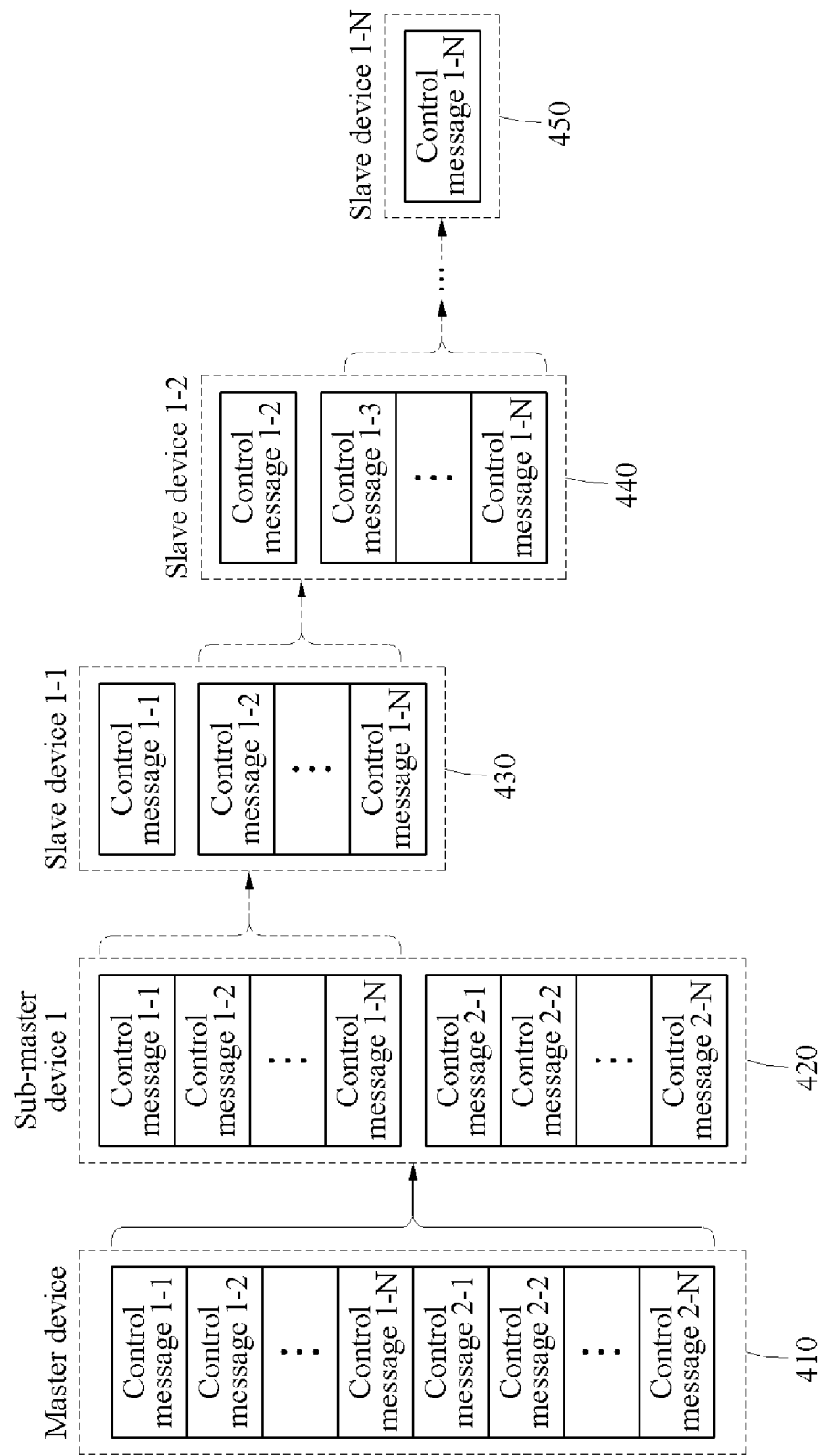
FIG. 4 illustrates an example of an operation of transmitting, to a slave device, a control message generated in a master device in the BMS of FIG. 3.

FIG. 4 illustrates an example of an operation of transmitting, to a slave device, a control message generated in a master device in the BMS. In an example, an optical signal including a control message is transmitted in an order from a slave device 1-1 to a slave device 1-N. A control message used for controlling a battery cell k-m is also referred to as a control message k-m.

FIG. 4 illustrates data 410 included in an electrical signal output from a master device to a wire interface. The data 410 includes at least one control message included in at least one battery pack. In the example of FIG. 4, the data 410 includes control messages 1-1 through 1-N corresponding to the battery pack 1 and control messages 2-1 through 2-N included in a battery pack 2 (not shown). The master device outputs the electrical signal including the data 410 to the wire interface. The output electrical signal is transmitted to a plurality of sub-master devices connected to the wire interface. The plurality of sub-master devices respectively corresponds to all battery packs in a battery.

FIG. 4 illustrates data 420 acquired by a sub-master device 1 based on the electrical signal received from the master device. In an example the data 420 is stored in a buffer of the sub-master device 1. When a control message is received from the master device through the wire interface, each of the plurality of sub-master devices identifies or extracts control messages associated with battery cells of a battery pack corresponding to each of the plurality of sub-master devices. The sub-master device 1 identifies data associated with the battery pack 1 corresponding to the sub-master device 1 (for example, the control messages 1-1 through 1-N) from the data 420.

Each of the plurality of sub-master devices outputs the extracted control message in a form of an optical signal. The sub-master device 1 generates an optical signal to be provided to slave devices 1-1 through 1-N connected to the sub-master device 1 based on the identified data. The sub-master device 1 separates control messages (for example, the control messages 1-1 through 1-N) associated with the battery pack 1 from the data 420. The sub-master device 1 generates the optical signal based on the separated control messages.

The sub-master device 1 generates the optical signal by combining the control messages 1-1 through 1-N. In an example, the sub-master device 1 combines the control messages 1-1 through 1-N based on an order in which the sub-master device 1 and the slave devices 1-1 through 1-N are arranged. For example, the sub-master device 1 sequentially combines the control messages 1-1 through 1-N such that an order of the control messages 1-1 through 1-N in the optical signal corresponds to an arrangement order of the slave devices 1-1 through 1-N. The sub-master device 1 adds a flag to the control message 1-N corresponding to a last slave device, for example, the slave device 1-N. In this example, the flag indicates that the control message 1-N corresponds to the last slave device. In an example, each of the slave devices determines whether a corresponding slave device is the last slave device based on whether the extracted control message includes the flag.

The optical signal output from each of the plurality of sub-master devices is transmitted in an order from a slave device closest from the sub-master device on an axis on which the sub-master device and the slave devices are arranged. Since the slave devices 1-1 through 1-N are arranged in series based on the sub-master device 1, the optical signal generated in the sub-master device 1 is transmitted to the slave device 1-1.

FIG. 4 illustrates data 430 acquired by the slave device 1-1 based on the optical signal received from the sub-master device 1. In an example, the slave device 1-1 stores the data 430 in a buffer. In an example, the order of the control messages 1-1 through 1-N included in the optical signal received from the sub-master device 1 corresponds to the order in which the slave devices 1-1 through 1-N are arranged.

The slave device 1-1 generates an optical signal to be transmitted to a subsequent ordinal slave device. For example, the slave device 1-1 generates an optical signal to be transmitted to the slave device 1-2 adjacent to the slave device 1-1 based on the data 430. In an example, the slave device 1-1 generates the optical signal to be transmitted to the slave device 1-2 based on remaining portion of the data 430 other than the control message 1-1 corresponding to the slave device 1-1.

The slave device 1-1 identifies the control message 1-1 associated with a battery cell 1-1 corresponding to the slave device 1-1 from the received optical signal. The slave device 1-1 separates the control message 1-1 from the data 430. In an example, the slave device 1-1 controls the battery cell 1-1 based on the control message 1-1. In an example, the slave device 1-1 performs a control of the battery cell 1-1 based on the control message 1-1 independently of generation of the optical signal to be transmitted from the slave device 1-1 to the slave device 1-2.

When an order of control messages included in the data 430 corresponds to the arrangement order of the slave devices 1-1 through 1-N, the slave device 1-1 acquires the control message 1-1 by separating a first control message from the data 430. In this example, the slave device 1-1 generates an optical signal including a second control message through a last control message of the data 430 and transmits the generated optical signal to the slave device 1-2.

FIG. 4 illustrates data 440 acquired based on the optical signal received by the slave device 1-2 from the slave device 1-1. In an example, the slave device 1-2 stores the data 440 in a buffer. An order of control messages in the data 440 corresponds to an order of the slave devices 1-2 through 1-N.

The slave device 1-2 identifies a control message 1-2 corresponding to the slave device 1-2 from the optical signal received from the slave device 1-1. The slave device 1-2 separates a first message of the data 440, for example, the control message 1-2 from the data 440. The slave device 1-2 generates an optical signal to be transmitted to a slave device 1-3 (not shown) based on remaining portion of the data 440 other than the control message 1-2.

Likewise, the slave device 1-3 acquires a control message 1-3 from the optical signal received from the slave device 1-2. While the optical signal generated in the sub-master device 1 is transmitted in an order from the slave device 1-1 to the slave device 1-N, a plurality of control messages included in the optical signal is sequentially provided to a corresponding slave device. In this example, while the optical signal generated in the sub-master device 1 is transferred in the order from the slave device 1-1 to the slave device 1-N, a plurality of control messages included in the optical signals is sequentially removed. When an order of the control messages 1-1 through 1-N in the optical signal corresponds to an arrangement order of the slave devices 1-1 through 1-N, a first ordinal control message is removed for each time that the optical signal is transferred to a slave device.

The optical signal output from the sub-master device 1 110 sequentially passes the plurality of slave devices to be transferred to the slave device 1-N. FIG. 4 illustrates data 450 acquired by the slave device 1-N from the transferred optical signal. Since N-1 slave devices between the sub-master device 1 and the slave device 1-N have separated corresponding control messages from the optical signal, the data includes a control message 1-N corresponding to the slave device 1-N. As such, each of the control messages corresponding to the battery cells 1-2 and 1-N received by the sub-master device 1 110 is transmitted to a corresponding slave device.

Figure 5:
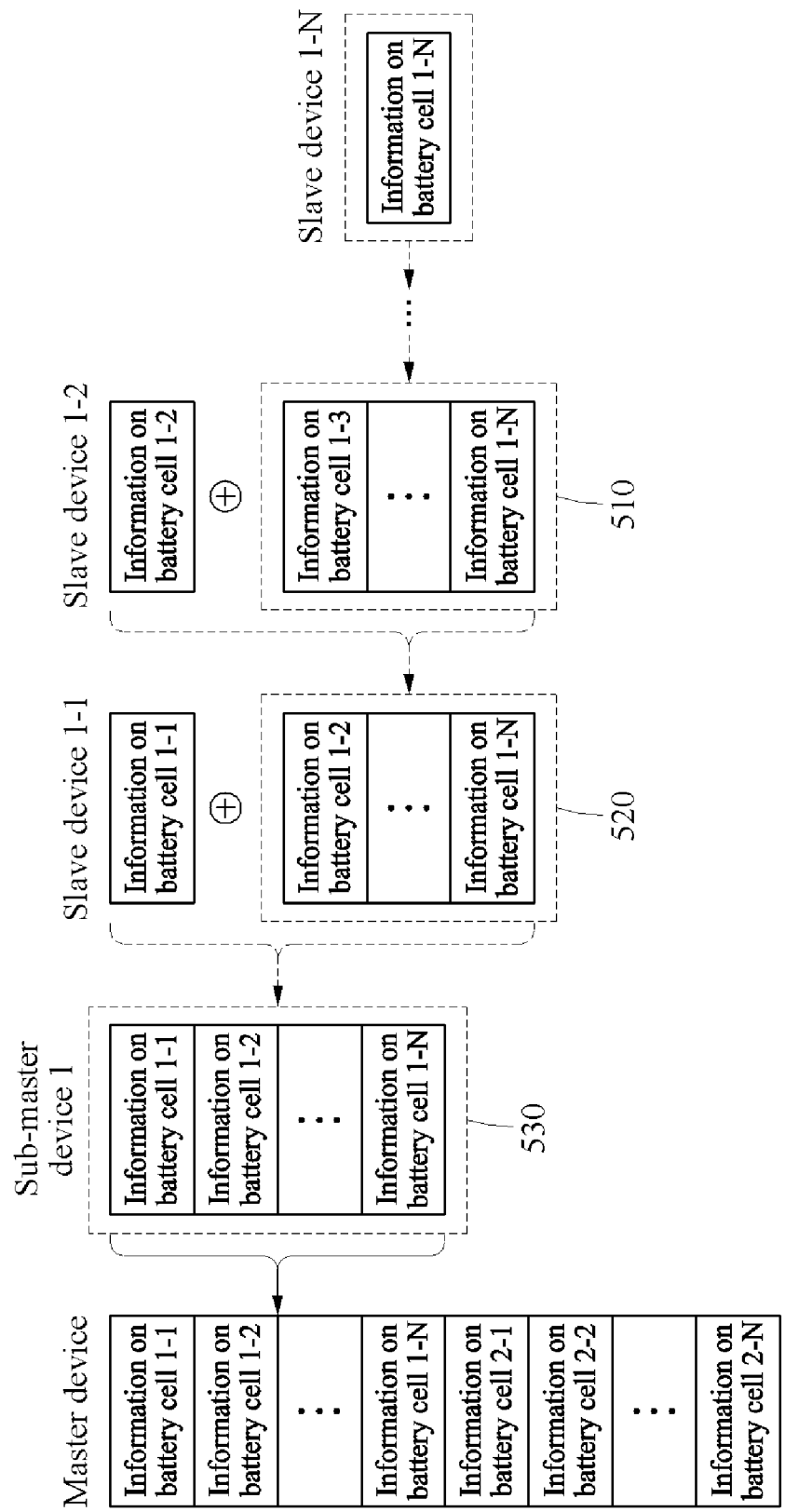
FIG. 5 illustrates an example of an operation of transmitting, to a master device, information acquired from slave devices 1-1 through 1-N in the BMS of FIG. 3.

FIG. 5 illustrates an example of an operation of transmitting, to a master device, information acquired from slave devices 1-1 through 1-N in the BMS of FIG. 3. Information acquired by a slave device 1-$a$ sequentially passes a slave device 1-$a$-1 through the slave device 1-1 to be transmitted to a sub-master device 1 and a master device. While passing the slave device 1-$a$-1 through the slave device 1-1, information acquired by each of the slave device 1-$a$-1 through the slave device 1-1 is combined with information acquired by a slave device 1-$a$.

The slave device 1-N acquires information associated with a battery cell 1-N. In an example, the information associated with the battery cell 1-N includes at least one of a temperature and a voltage of the battery cell 1-N. The slave device 1-N generates an optical signal including the information associated with the battery cell 1-N and transmits the optical signal to the slave device 1-N-1.

When the information associated with the battery cell 1-N is included in the received optical signal, the slave device 1-N-1 combines the optical signal with information associated with the battery cell 1-N-1 and transmits the combined information to the slave device 1-N-2. While the optical signal including the information associated with the battery cell 1-N is sequentially transferred to a plurality of slave device, starting from the slave device 1-N, information associated with a plurality of battery cells corresponding to the plurality of slave devices is accumulated in the optical signal.

The optical signal transmitted from the slave device 1-N sequentially passes slave devices based on the aforementioned operation, and is transmitted to the slave device 1-2. FIG. 5 illustrates data 510 included in the optical signal received by the slave device 1-2 from a slave device 1-3. In an example, the data 510 is stored in a buffer of the slave device 1-2.

When the optical signal transmitted from the slave device 1-N passes the slave device 1-N through the slave device 1-3 and arrives at the slave device 1-2, the data 510 includes information associated with the battery cell 1-N through a battery cell 1-3. Since the received optical signal includes information associated with a battery cell instead of a control message, the slave device 1-2 determines to combine the received optical signal with information associated with a battery cell 1-2 and transmit the combined information. In this example, the slave device 1-2 combines the information associated with the battery cell 1-2 with the data 510.

The slave device 1-2 combines the information associated with the battery cell 1-2 with the data 510 based on an order in which the slave devices 1-1 through 1-N are arranged.

Referring to FIG. 5, the slave device 1-2 generates an optical signal to be transmitted to the slave device 1-1 by adding the data 510 at the end of the information associated with the battery cell 1-2. In this example, an order of items of information associated with a plurality of battery cells in the optical signal corresponds to an order of the plurality of slave devices. The generated optical signal is transmitted to the slave device 1-1 through a remaining optical signal transceiver of the slave device 1-2, which is different than from an optical signal transceiver of the slave device 1-2 having received the optical signal.

FIG. 5 illustrates data 530 received by the slave device 1-1 from the slave device 1-2. Since the data 520 includes information associated with the battery cells 1-2 through 1-N instead of a control message, the slave device 1-1 combines the data 520 with the information associated with the battery cell 1-1 and transmits a result of the combining to the sub-master device 1. Similarly, the slave device 1-1 generates an optical signal to be transmitted to the sub-master device 1 by combining the data 520 at the end of the information associated with the battery cell 1-1 such that the information associated with battery cells included in the optical signal to be output from the slave device 1-1 corresponds to an order in which the battery cells are arranged.

While the optical signal generated in the slave device 1-N is sequentially transferred in an order from the slave device 1-N to the slave device 1-1, the information associated with the battery cells 1-N through 1-1 is combined with data included in the optical signal. New information added to the data included in the optical signal is combined at the beginning or end of the data such that an order of items of the information associated with the battery cells 1-N through 1-1 in the optical signal corresponds to an order in which the battery cell 1-N through the battery cell 1-1.

The optical signal transferred to the sub-master device 1 includes information collected by the slave device 1-N having generated the optical signal and other slave devices between the slave device 1-N and the sub-master device 1. When the slave device 1-N transmits the optical signal to the sub-master device 1, the sub-master device 1 acquires all information associated with the N battery cells by receiving a single optical signal.

FIG. 5 illustrates data 530 included in the optical signal received by the sub-master device 1 from the slave device 1-1. When each of the slave device 1-N through the slave device 1-1 combines information associated with a corresponding battery cell with the optical signal based on the order in which the battery cell 1-N through the battery cell 1-N are arranged, the information associated with the battery cell 1-N through the battery cell 1-1 in the data 530 is arranged based on the order in which the battery cell 1-N through the battery cell 1-1 are arranged.

The sub-master device 1 generates an electrical signal to be transmitted to the master device based on the data 530. In an example, the sub-master device 1 outputs the generated electrical signal to a wire interface. The master device acquires information associated with each of a plurality of battery cells included in the battery pack 1 from the electrical signal. The acquired information is used to control a cell balance.

Figure 6:
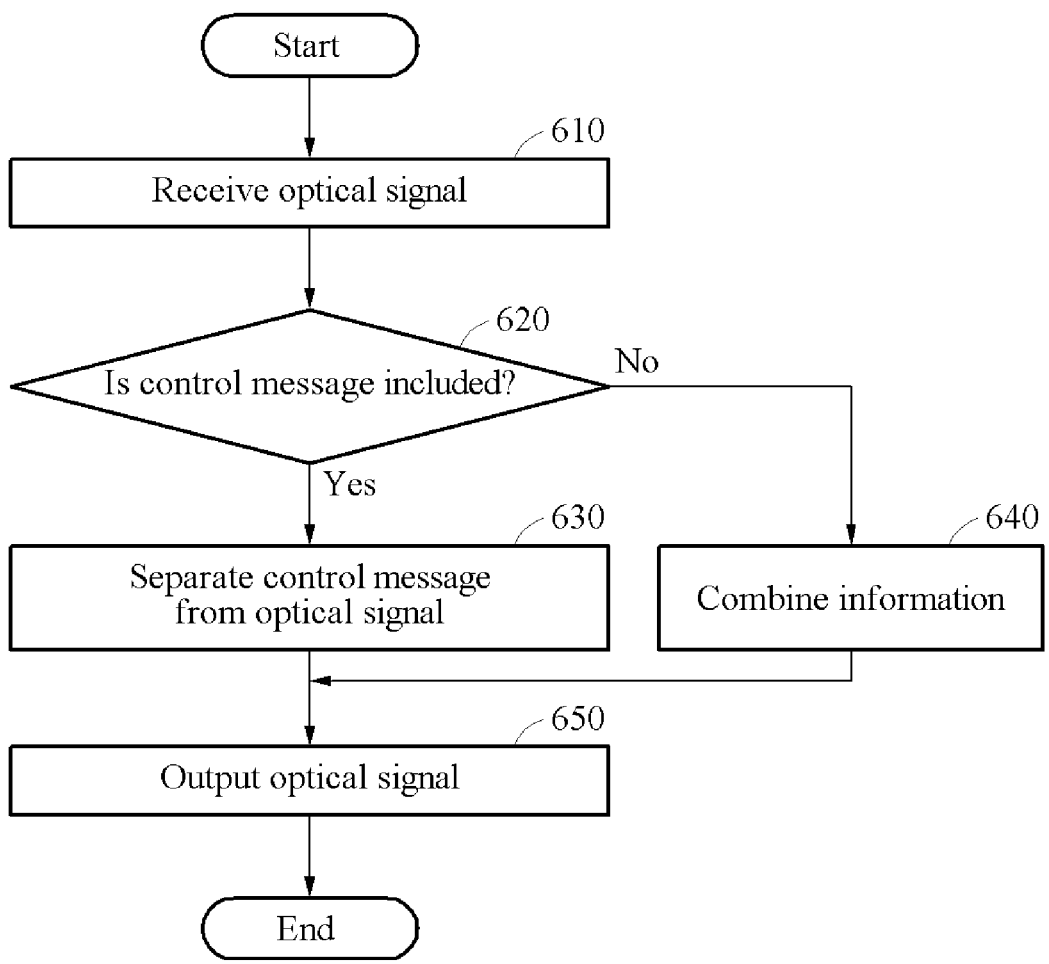
FIG. 6 illustrates an example of an operation performed by a slave device of a BMS.

FIG. 6 illustrates an example of an operation performed by a slave device of a BMS. The operations in FIG. 6 may be performed in the sequence and manner as shown, although the order of some operations may be changed or some of the operations omitted without departing from the spirit and scope of the illustrative examples described. Many of the operations shown in FIG. 6 may be performed in parallel or concurrently. One or more blocks of FIG. 6, and combinations of the blocks, can be implemented by special purpose hardware-based computer that perform the specified functions, or combinations of special purpose hardware and computer instructions. In addition to the description of FIG. 6 below, the descriptions of FIGS. 1-5 are also applicable to FIG. 6, and are incorporated herein by reference. Thus, the above description may not be repeated here.

Referring to FIG. 6, in operation 610, a slave device receives an optical signal using one of a plurality of optical signal transceivers. The plurality of optical signal transceivers is arranged toward different slave devices or a sub-master device.

In operation 620, the slave device determines whether the received optical signal includes a control message associated with a battery cell corresponding to the slave device. In an example, the slave device generates data to be transmitted to a sub-master device or another slave device adjacent to the slave device based on whether the received optical signal includes the control message associated with the battery cell. The data to be transmitted to the sub-master device or the other slave device is generated based on data included in the optical signal received in operation 610.

When the received optical signal includes the control message associated with the battery cell corresponding to the slave device, in operation 630, the slave device separates the control message from the optical signal. The slave device extracts the control message corresponding to the slave device from the data included in the received optical signal. In an example, when the optical signal includes a plurality of control messages, the slave device separates a first control message or a last control message. The slave device determines remaining data other than the control message associated with the battery cell corresponding to the slave device, to be the data to be transmitted to the sub-master device or the other slave device.

When the control message corresponding to the slave device is extracted from the data included in the optical signal, the slave device controls the battery cell corresponding to the slave device based on the extracted control message. In an example, the control message includes a message for controlling charging and discharging of the battery cell.

When the received optical signal does not include the control message associated with the battery cell corresponding to the slave device, in operation 640, the slave device combines information included in the received optical signal and information associated with the battery cell corresponding to the slave device. The slave device determines data obtained by combining the information included in the received optical signal and the information associated with the battery cell corresponding to the slave device, to be data to be transmitted to another slave device or the sub-master device. The information associated with the battery cell corresponding to the slave device is combined at the beginning or end of the data included in the optical signal. The information associated with the battery cell includes any one or any combination of information such as, for example, a temperature of the battery cell, a voltage of the battery cell, and a cell balancing of a plurality of battery cells including the battery cell.

In operation 650, the slave device outputs the data generated or determined in operation 630 or 640 as an optical signal. Among the plurality of optical signal transceivers included in the slave device, the slave device performs photoelectric transformation on the data generated or determined in operation 630 or 640 using remaining optical signal transceivers other than an optical signal transceiver used to receive the optical signal in operation 610. The optical signal generated through the photoelectric transformation is output using the remaining signal transceivers. The optical signal output from the slave device is transmitted to another slave device differing from the slave device having transmitted the optical signal in operation 610. As such, the data included in the optical signal received in operation 610 is relayed to another slave device or the sub-master device.

Figure 7:
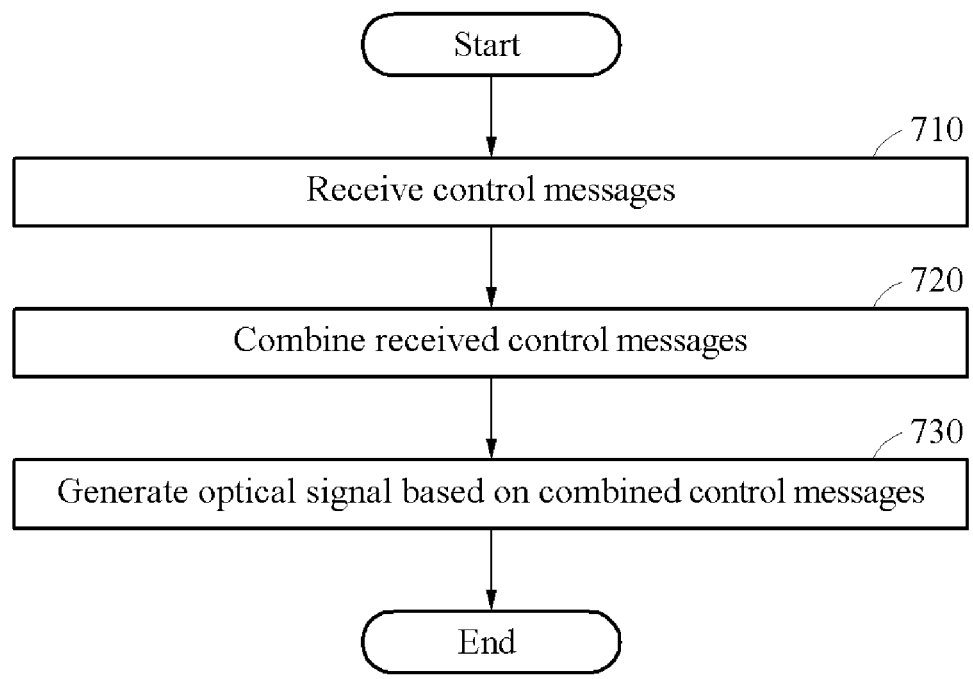
FIG. 7 illustrates an example of an operation of a sub-master device transferring a control message received from a master device to a slave device in a BMS.

FIG. 7 illustrates an example of an operation of a sub-master device transferring a control message received from a master device to a slave device in a BMS. The operations in FIG. 7 may be performed in the sequence and manner as shown, although the order of some operations may be changed or some of the operations omitted without departing from the spirit and scope of the illustrative examples described. Many of the operations shown in FIG. 7 may be performed in parallel or concurrently. One or more blocks of FIG. 7, and combinations of the blocks, can be implemented by special purpose hardware-based computer that perform the specified functions, or combinations of special purpose hardware and computer instructions. In addition to the description of FIG. 7 below, the descriptions of FIGS. 1-6 are also applicable to FIG. 7, and are incorporated herein by reference. Thus, the above description may not be repeated here.

Referring to FIG. 7, in operation 710, a sub-master device receives control messages associated with battery cells included in a battery pack corresponding to the sub-master device from a master device connected through a wire interface. In the wire interface, the control messages are transmitted in a form of electrical signal to the sub-master device.

In operation 720, the sub-master device combines the received control messages based on an order in which a plurality of slave devices controlling each of the battery cells is connected in series. The sub-master device combines a flag with a control message corresponding to a last slave device. In an example, the flag indicates that the control message corresponds to the last slave device or a last battery cell.

In operation 730, the sub-master device generates an optical signal based on the combined control messages. In the generated optical signal, an order of the control messages corresponds to the order in which the plurality of slave devices is connected in series. The sub-master device outputs the generated optical signal to a first slave device among the plurality of slave devices based on the order in which the plurality of slave devices is connected in series. The optical signal outputs through an optical signal transceiver disposed toward the first slave device.

When the plurality of slave devices is connected in series, the optical signal is sequentially transferred to the plurality of slave devices, starting from the first slave device. Thus, based on the order in which the plurality of slave devices is connected in series, the control messages included in the optical signal are sequentially transferred to the plurality of slave devices.

Figure 8:
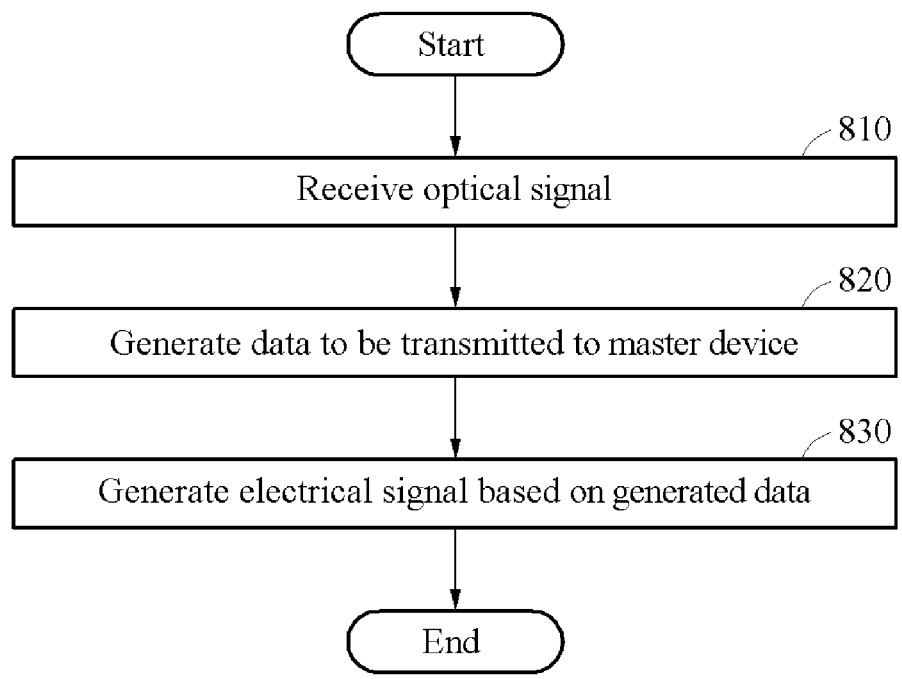
FIG. 8 illustrates an example of an operation of a sub-master device transferring information received from a slave device to a master device in a BMS.

FIG. 8 illustrates an example of an operation of a sub-master device transferring information received from a slave device to a master device in a BMS. The operations in FIG. 8 may be performed in the sequence and manner as shown, although the order of some operations may be changed or some of the operations omitted without departing from the spirit and scope of the illustrative examples described. Many of the operations shown in FIG. 8 may be performed in parallel or concurrently. One or more blocks of FIG. 8, and combinations of the blocks, can be implemented by special purpose hardware-based computer that perform the specified functions, or combinations of special purpose hardware and computer instructions. In addition to the description of FIG. 8 below, the descriptions of FIGS. 1-7 are also applicable to FIG. 8, and are incorporated herein by reference. Thus, the above description may not be repeated here.

Referring to FIG. 8, in operation 810, a sub-master device receives an optical signal from a slave device. The optical signal is transferred from a first slave device closest to the sub-master device. In an example, the optical signal is an optical signal relayed from one of a plurality of slave devices.

In operation 820, the sub-master device generates data to be transmitted to a master device based on the received optical signal. The optical signal received by the sub-master device includes information associated with the battery cell, and the information is acquired from all slave device that have relayed the optical signal. Thus, data generated by the sub-master device includes information associated with the battery cell included in a battery pack corresponding to the sub-master device.

In operation 830, the sub-master device generates an electrical signal based on the generated data. The generated electrical signal is transmitted to the master device through the wire interface connected to the sub-master device. When the wire interface is structured based on a bus topology, the electrical signal transmitted from the sub-master device is transmitted to all devices (including the mater device and other sub-master devices) connected to the wire interface. In response to the electrical signal being received, the other sub-master devices discard the electrical signal based on data included in the received electrical signal.

A BMS manages a battery using a master device, a sub-master device corresponding to each of battery packs, and a slave device corresponding to each of battery cells. Data transmitted from the master device through the sub-master device to the slave device includes a control message for controlling a battery cell. Data transmitted from the slave device through the sub-master device to the master device includes information associated with a battery cell and acquired by the slave device. The master device and a plurality of sub-master devices transmit and receive data using an electrical signal. In a battery pack, the sub-master device and a plurality of slave devices transmit and receive data using an optical signal.

Since the sub-master device and the plurality of slave devices transmit and receive the data using the optical signal, a battery cell or a slave device is assembled or installed without need to use a separate wire. Also, because an electrical signal or an electromagnetic wave is not generated, an electromagnetic interference (EMI) level of the BMS is reduced.

The optical signal output from the sub-master device to the plurality of slave devices includes a combination of control messages. The optical signal generated in the sub-master device is sequentially transmitted to the plurality of slave devices along an axis on which the sub-master device and the plurality of slave devices are arranged. A slave device receiving the optical signal separates a control message associated with a battery cell corresponding to the slave device from the received optical signal. While the optical signal generated in the sub-master device is sequentially transmitted to the plurality of slave devices, the slave device receiving the optical signal separates the control signal corresponding to the slave device form the optical signal and thus, a number of control messages included in the optical signal are gradually reduced.

An optical signal output from a slave device toward the sub-master device is, when another slave device is present between the slave device and the sub-master device, transmitted to the sub-master device by sequentially passing through the other slave devices. The optical signal output from the slave device includes information associated with a battery cell corresponding to the slave device. While passing through other slave devices, the optical signal is combined with information associated with a battery cell corresponding to each slave device.

The optical signal received by the sub-master device includes information associated with battery cells corresponding to the slave device and the at least another slave device. The sub-master device or the master device identifies battery cells or slave devices based on the information associated with the battery cells and included in the received optical signal. For example, the sub-master device or the master device determines a number of battery cells included in the battery pack based on a number of items of the information associated with the battery cells and included in the received optical signal. Also, the battery cell or the slave device is installed in or separated from the battery without a change in setting of the sub-master device or the master device.

The controller 331, CAN communicator 311, CAN communicator 321, cell balance controller 335, cell balance controllers, CAN communicators, and other controllers, apparatuses, units, modules, devices, and components described herein are implemented by hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 4-8 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control a processor or computer to implement the hardware components and perform the methods as described above are written as computer programs, code segments, instructions or any combination thereof, for individually or collectively instructing or configuring the processor or computer to operate as a machine or special-purpose computer to perform the operations performed by the hardware components and the methods as described above. In an example, the instructions or software includes at least one of an applet, a dynamic link library (DLL), middleware, firmware, a device driver, an application program storing the method of preventing the collision. Programmers of ordinary skill in the art can readily write the instructions or software based on the block diagrams and the flow charts illustrated in the drawings and the corresponding descriptions in the specification, which disclose algorithms for performing the operations performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access programmable read only memory (PROM), electrically erasable programmable read-only memory (EEPROM), random-access memory (RAM), dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and providing the instructions or software and any associated data, data files, and data structures to a processor or computer so that the processor or computer can execute the instructions. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processor or computer.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A battery management system (BMS) associated with battery packs comprising a master device controlling the battery packs, the BMS comprising:
   a sub-master device corresponding to a battery pack among the battery packs; and
   slave devices corresponding to battery cells in the battery pack,
   wherein the each of the slave devices are configured to communicate with another slave device of the slave devices based on an order in which the slave devices are arranged using an optical signal, and the sub-master device is configured to communicate with the master device and a first slave device of the slave devices,
   wherein, in response to an optical signal being transmitted from a previous slave device of the slave devices, a controller of a current slave device is configured to separate a control message associated with the battery cell corresponding to the current slave device from control messages included in the optical signal, and to transmit remaining control messages other than the separated control message to a next slave device of the slave devices based on an order in which the slave devices are arranged, and
   wherein in response to the optical signal being transmitted from the next slave device and including information associated with a state of a battery cell other than a battery cell corresponding to the current slave device, the current slave device is further configured to combine information associated with a state of the corresponding battery cell with the optical signal and to relay the combined optical signal to the previous slave device of the slave devices based on an inverse order in which the slave devices are arranged.

2. The BMS of claim 1, wherein the optical signal is sequentially transmitted based on an order in which the slave devices are arranged in each of the battery packs.

3. The BMS of claim 1, wherein a slave device of the slave devices further comprises:
   a cell balance controller configured to control a balance in a quantity of electric charge in the battery cells.

4. The BMS of claim 3, wherein the controller is further configured to output, using the optical signal transceiver, information on the voltage or the temperature measured by a sensor of the current slave device to a previous slave device of the slave devices based on an inverse order in which the slave devices are arranged.

5. The BMS of claim 3, wherein the controller is further configured to combine information including the voltage or the temperature measured by the sensor with information included in the optical signal and output the combined information using another optical signal transceiver of the current slave device, in response to an optical signal being received from the optical signal transceiver.

6. The BMS of claim 1, wherein the sub-master device is configured to:
   extract control messages associated with battery cells included in a battery pack corresponding to the sub-master device, from control messages received from the master device;
   combine the extracted control messages based on an order in which the slave devices corresponding to the sub-master device are arranged; and
   output an optical signal based on the combined control messages to the first slave device based on the order in which the slave devices are arranged.

7. The BMS of claim 6, wherein the sub-master device is further configured to combine a flag with a control message corresponding to a last slave device based on the order in which the slave devices are arranged, and
   wherein the flag verifies that a slave device receiving a control message is the last slave device.

8. The BMS of claim 1, wherein the master device and the sub-master device is connected through a wire interface through which an electrical signal including information on each of the battery cells or a control message corresponding to the battery cells is transmitted.

9. The BMS of claim 1, wherein the slave devices are arranged to correspond to battery cells connected in series.

10. A battery management method performed by a current slave device corresponding to a battery cell, the method comprising:
    receiving an optical signal;

determining whether the received optical signal comprises a control message associated with the battery cell;

generating data to be transmitted to a sub-master device corresponding to a battery pack including the battery cell or to another slave device in the battery pack, in response to the received optical signal comprising the control message associated with the battery cell; and outputting the generated data through an opto-electric transformation, wherein the generating comprises:

separating the control message associated with the battery cell from the control messages in the received optical signal transmitted from a previous slave device of slave devices, generating the data to be transmitted to a next slave device of the slave devices based on an order in which the slave devices are arranged based on remaining control messages other than the separated control message, and wherein in response to the optical signal being transmitted from the next save device and including information associated with a state of a battery cell other than a battery cell corresponding to the current slave device, combining information associated with a state of the corresponding battery cell with the optical signal; and relaying the combined optical signal to a previous slave device of the slave devices base on an inverse order in which the slave devices are arranged.

11. The battery management method of claim 10, wherein the receiving of the optical signal comprises receiving the optical signal from an optical signal receiver disposed toward the sub-master device or the other slave device.

12. The battery management method of claim 10, further comprising:

controlling the battery cell based on the control message, in response to the received optical signal comprising the control message associated with the battery cell.

13. The battery management method of claim 10, wherein the generating comprises:

combining information in the received optical signal with information acquired from the battery cell, in response to the received optical signal not including the control message associated with the battery cell; and generating the data to be transmitted to the sub-master device or the other slave device based on the combined information.

14. The battery management method of claim 13, wherein the information acquired from the battery cell comprises any one or any combination of a temperature of the battery cell, a voltage of the battery cell, and a cell balancing of a plurality of battery cells including the battery cell.

15. The battery management method of claim 10, wherein the outputting comprises outputting the generated data using an optical signal transmitter disposed toward the sub-master device or the other slave device.

* * * * *